(12) United States Patent
Chien

(10) Patent No.: US 7,545,023 B2
(45) Date of Patent: Jun. 9, 2009

(54) SEMICONDUCTOR TRANSISTOR

(75) Inventor: Chin-Cheng Chien, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 359 days.

(21) Appl. No.: 10/907,125

(22) Filed: Mar. 22, 2005

(65) Prior Publication Data

US 2006/0214236 A1    Sep. 28, 2006

(51) Int. Cl.
*H01L 29/20* (2006.01)
(52) U.S. Cl. .................. 257/616; 257/387; 438/299; 438/478
(58) Field of Classification Search ........... 257/387, 257/616; 438/299, 478
See application file for complete search history.

(56) References Cited

U.S. PATENT DOCUMENTS

| | | | | |
|---|---|---|---|---|
| 5,821,577 A * | 10/1998 | Crabbe' et al. | ............... | 257/288 |
| 6,218,711 B1 * | 4/2001 | Yu | ............................... | 257/384 |
| 6,313,486 B1 * | 11/2001 | Kencke et al. | ............... | 257/192 |
| 6,509,586 B2 * | 1/2003 | Awano | ........................ | 257/192 |
| 6,605,498 B1 | 8/2003 | Murthy et al. | ............... | 438/197 |
| 6,621,131 B2 | 9/2003 | Murthy et al. | ............... | 257/408 |
| 6,689,671 B1 * | 2/2004 | Yu et al. | ...................... | 438/486 |

* cited by examiner

*Primary Examiner*—Matthew Smith
*Assistant Examiner*—Colleen E Rodgers
(74) *Attorney, Agent, or Firm*—Winston Hsu

(57) ABSTRACT

A semiconductor transistor includes a substrate, a gate insulating layer positioned on the surface of the substrate, a gate positioned on the gate insulating layer, a channel region positioned in the substrate corresponding to the gate, and a source region and a drain region respectively positioned alongside the channel region. The source region and the drain region are mainly made of a first material and a second material, wherein the first material and the second material have a same lattice structure and different spacing. The source region and the drain region each include a main region in which a percentage of the second material is constant, and a peripheral region in which a percentage of the second material is graded.

10 Claims, 8 Drawing Sheets

SEMICONDUCTOR TRANSISTOR

BACKGROUND OF INVENTION

1. Field of the Invention

The present invention relates to a semiconductor transistor and method for making the same, and more particularly, to a semiconductor transistor with strained source/drain regions that have a reduced interface mismatch defect, and method for making the same.

2. Description of the Prior Art

The performance of semiconductor transistors has increased year after year with the diminution of critical dimensions and the advance of large-scale integrated circuits (LSI). However, it has been recently pointed out that the miniaturization attained by a lithographic technology has reached its limit. Therefore, how to improve the carrier mobility so as to increase the speed performance of semiconductor transistors has become a major topic for study in the semiconductor field. Attempts have been made to use strained source/drain regions made of silicon germanium, for instance. In this type of semiconductor transistor, a compressive strain occurs in the channel region due to the silicon germanium which has a larger spacing than silicon, and, as a result, the band structure alters, and the carrier mobility increases. This enhances the speed performance of the MOS transistors.

Please refer to FIG. 1. FIG. 1 is a schematic diagram of a conventional PMOS transistor. As shown in FIG. 1, the conventional PMOS transistor includes a substrate 10 made of monocrystalline silicon, two field isolation regions 12 positioned in the substrate 10, a gate insulating layer 14 positioned on the surface of the substrate 10, a gate 16 positioned on the gate insulating layer 14, and a channel region 18 corresponding to the gate 16 positioned in the substrate 10. The PMOS transistor further includes two lightly doped regions 20 respectively positioned alongside the channel region 18, and a source region 22 and a drain region 24 respectively positioned on opposite sides of the lightly doped regions 20. The source region 22 and the drain region 24 are P type, and made of silicon germanium in which the percentage of germanium is held constant, for example at 30%.

The conventional PMOS transistor suffers some disadvantages. First, the critical thickness of the source region and the drain region is limited to prevent the silicon germanium from peeling. In addition, interface mismatch defects tend to occur between the silicon germanium and the substrate (monocrystalline silicon) because the percentage of germanium between the source region 22 and the drain region 24 (30%), and the substrate 10 (close to 0%) is too large.

SUMMARY OF INVENTION

It is therefore a primary object of the claimed invention to provide a semiconductor transistor and method for making the same to overcome the aforementioned problems.

According to the claimed invention, a semiconductor transistor is disclosed. The semiconductor transistor includes a substrate, a gate insulating layer positioned on the surface of the substrate, a gate positioned on the gate insulating layer, a channel region positioned in the substrate corresponding to the gate, and a source region and a drain region respectively positioned alongside the channel region. The source region and the drain region are mainly made of a first material and a second material, wherein the first material and the second material have a same lattice structure and different spacing. The source region and the drain region each include a main region in which a percentage of the second material is constant, and a peripheral region in which a percentage of the second material is graded.

The source region and the drain region each include a main region in which the percentage of the second material (germanium or carbon) is held constant and a peripheral region in which the percentage of the second material is graded. Accordingly, the interface mismatch defect between the source region (also the drain region) and the substrate is reduced. Therefore, the reliability and performance of the semiconductor transistor of the present invention is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
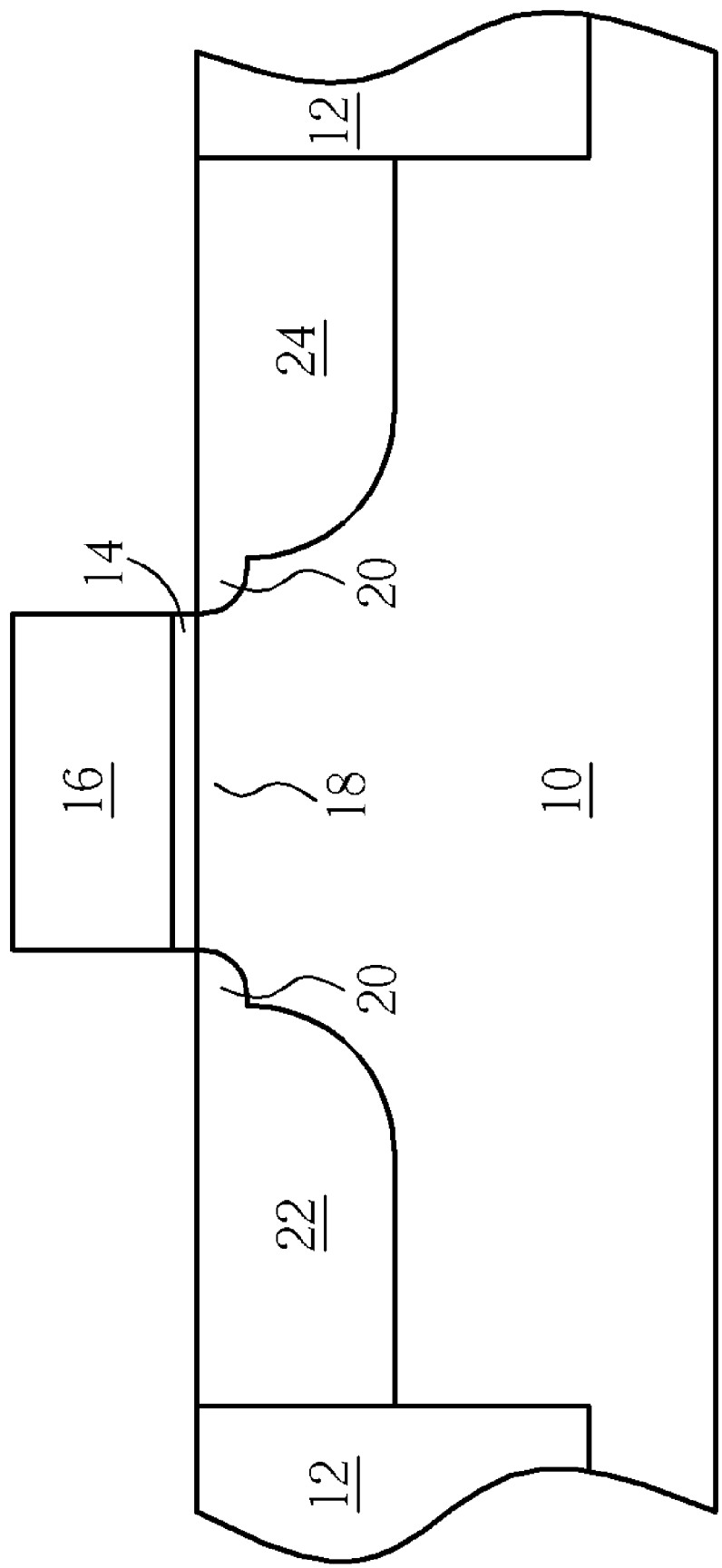
FIG. 1 is a schematic diagram of a conventional PMOS transistor.
Figure 2:
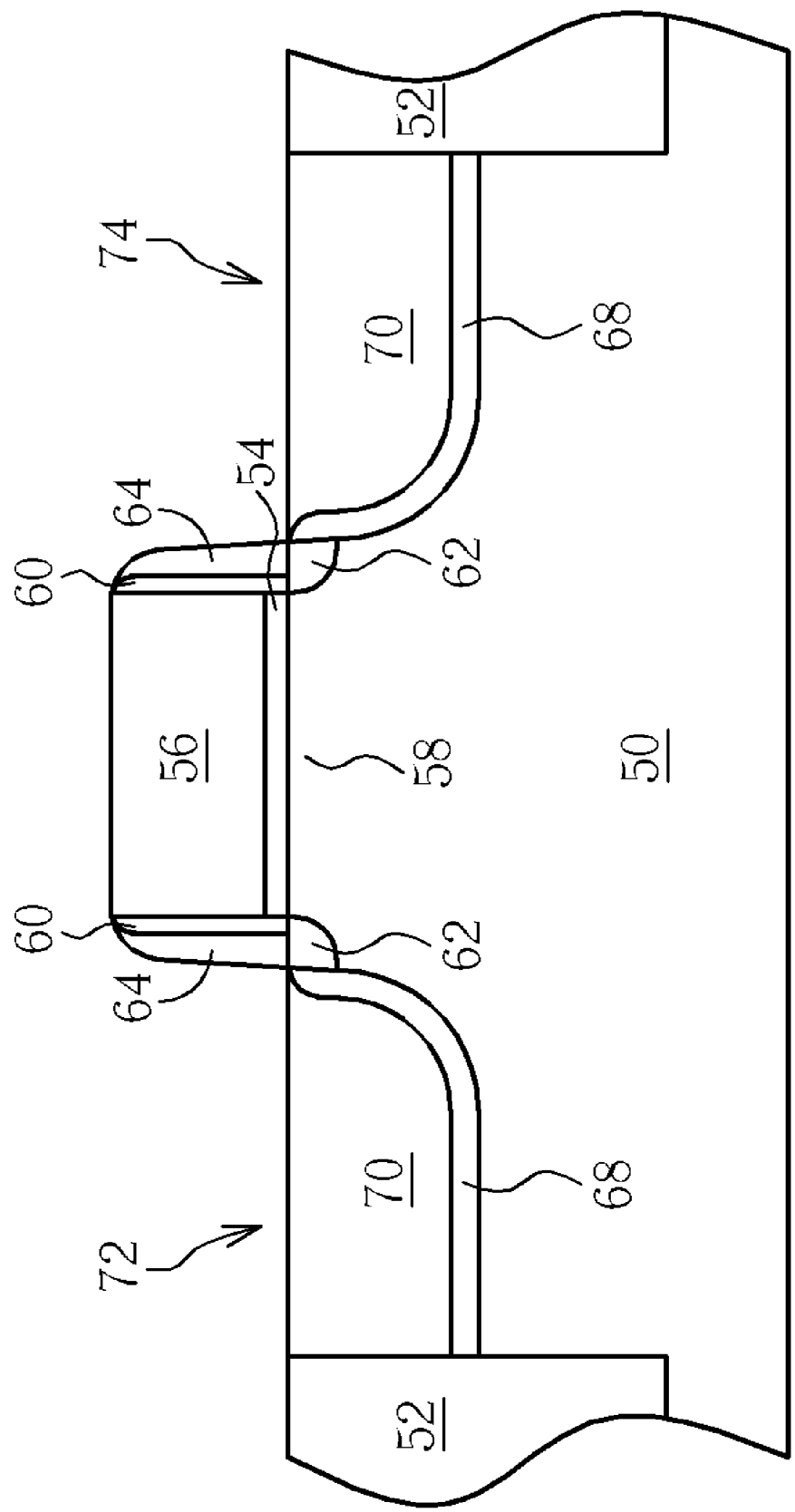
FIG. 2 is a schematic diagram of a semiconductor transistor according to a preferred embodiment of the present invention.

Please refer to FIG. 2. FIG. 2 is a schematic diagram of a semiconductor transistor according to a preferred embodiment of the present invention. As shown in FIG. 2, the semiconductor transistor includes a substrate 50 made of monocrystalline silicon, a plurality of field isolation regions 52, such as shallow trench insulations (STI), formed in the substrate 50, a gate insulating layer 54 positioned on the surface of the substrate 50, a gate 56 positioned on the gate insulating layer 54, and a channel region 58 positioned in the substrate 50. The semiconductor transistor further includes spacers, including offset spacers 60 and main spacers 64, alongside the gate 56, two lightly doped regions 62 positioned on two opposite sides of the channel region 58, a source region 72 and a drain region 74 positioned on two opposite sides of the lightly doped regions 62.

Each of the source region 72 and the drain region 74 includes a peripheral region 68 and a main region 70 positioned above the peripheral region 68. In this embodiment, the semiconductor transistor is a PMOS transistor, and the source region 72 and the drain region 74 are mainly made of silicon germanium that is formed epitaxially. Germanium has a smaller spacing than monocrystalline silicon, and thus the channel region 58 is compressed. To prevent the mismatch defects in the interface between the source region 72 (also the drain region 74) and the substrate 50, the percentage of germanium in the peripheral region 68 is graded. Specifically, the percentage of germanium in the peripheral region 68 decreases from the interface between the main region 70 and the peripheral region 68 to the interface between the peripheral region 68 and the substrate 50. On the other hand, the percentage of germanium in the main region 70 is held constant. By virtue of the graded peripheral region 68 positioned between the substrate 50 and the main region 70, the interface mismatch defect is reduced. In this embodiment, the percentage of germanium in the main region 70 is approximately 30%, and that in the peripheral region 68 decreases from 30% to 0%.

The composition of the main region 70 and the peripheral region 68 is not limited, and can be optimized. In addition, if the semiconductor transistor is N type, then germanium is replaced by other materials, such as carbon that has a larger spacing than monocrystalline silicon. Accordingly, a tensile stress acts on the channel region 58.

Figure 3:
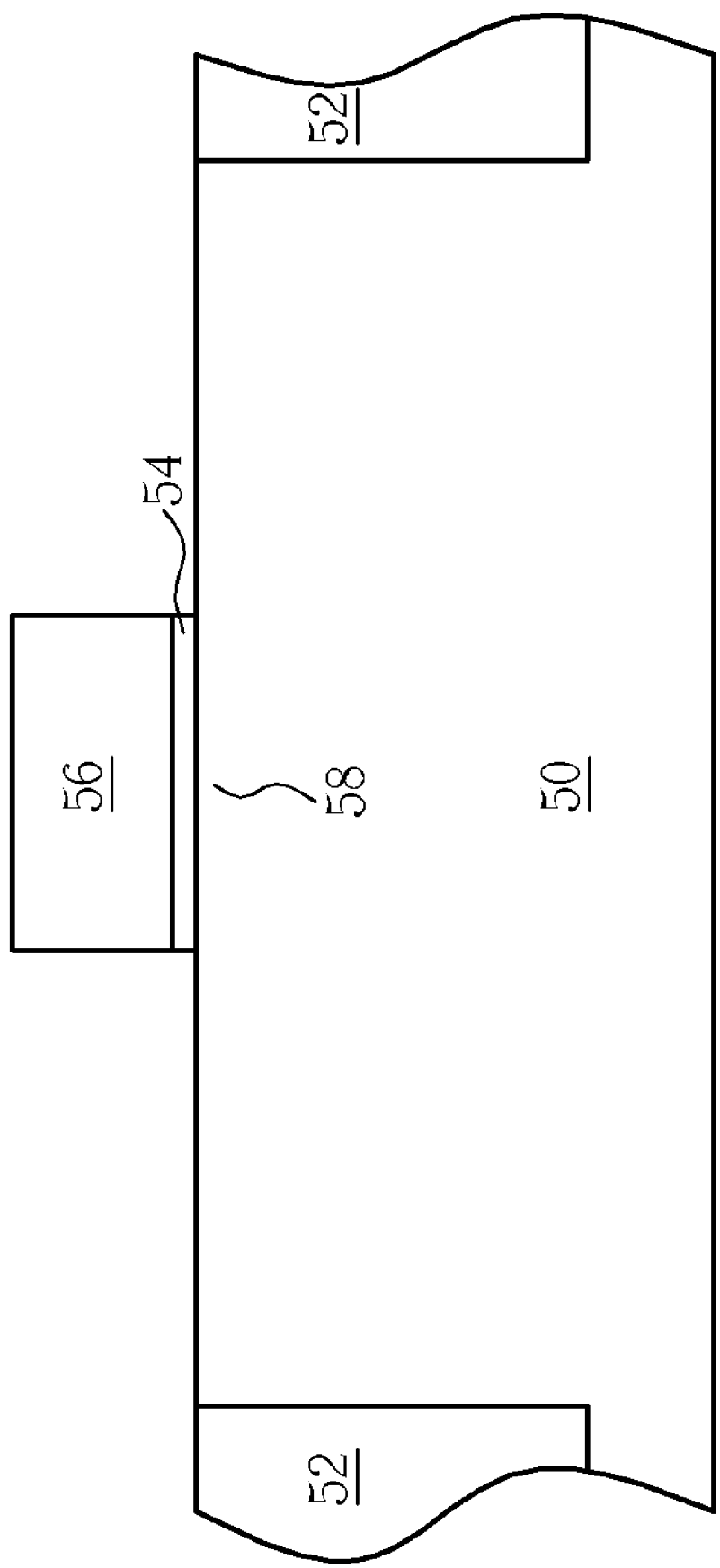
FIG. 3 through FIG. 8 are schematic diagrams illustrating a method for forming a semiconductor transistor according to another embodiment of the present invention.

Please refer to FIG. 3 through FIG. 8. FIG. 3 through FIG. 8 are schematic diagrams illustrating a method for forming a semiconductor transistor according to another embodiment of the present invention. As shown in FIG. 3, a substrate 50 made of monocrystalline silicon is provided. The substrate 50 includes a plurality of field isolation regions 52, such as shallow trench insulations (STI), formed in the substrate 50, a gate insulating layer 54 positioned on the surface of the substrate 50, a gate 56 positioned on the gate insulating layer 54, and a channel region 58 positioned in the substrate 50.

Figure 4:
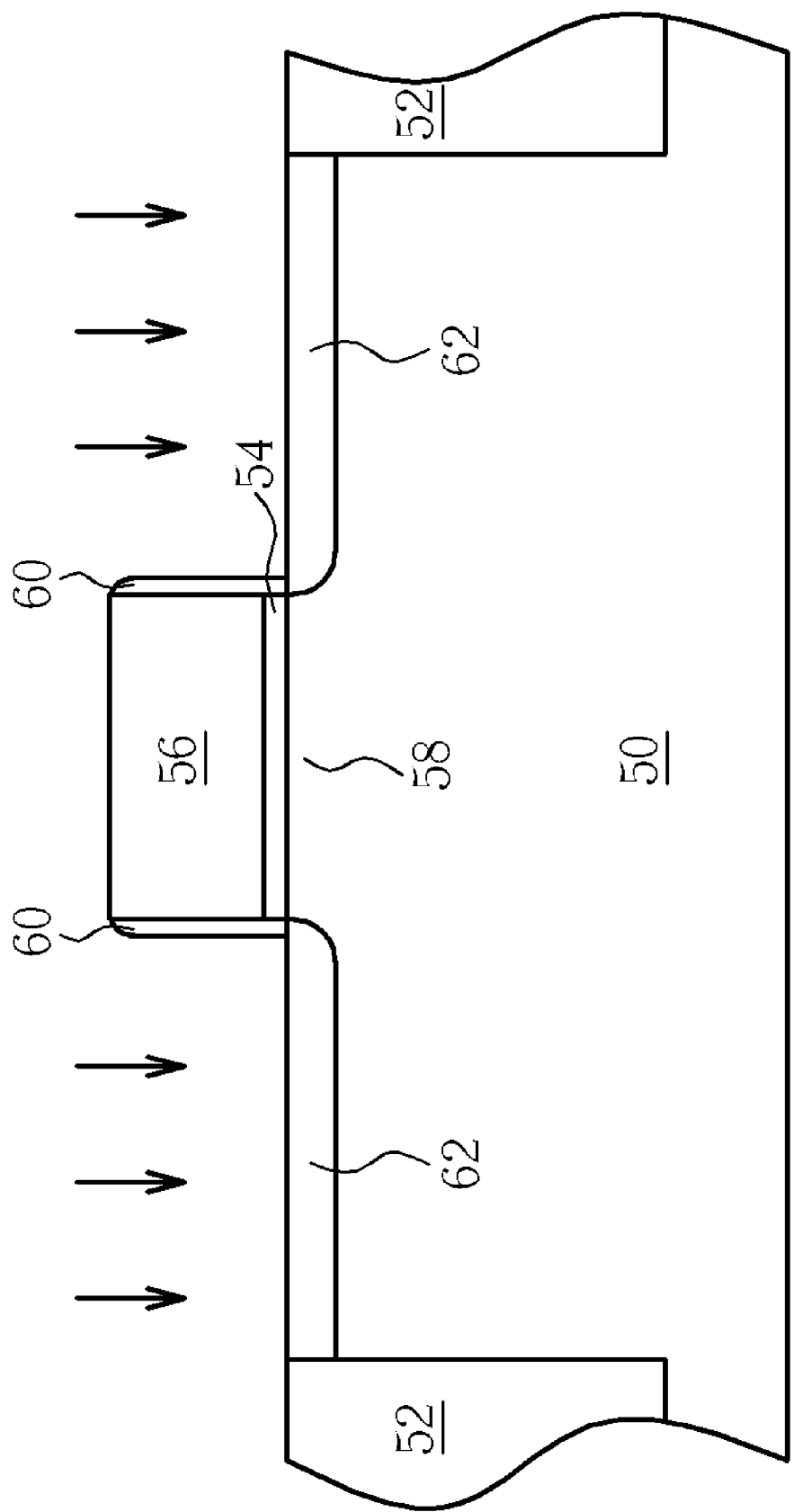

As shown in FIG. 4, two offset spacers 60 are formed alongside the gate 56 and the gate insulating layer 54. Subsequently, an implantation process and an annealing process are consecutively performed to form two lightly doped regions 62 in the substrate on two opposite sides of the channel region 58. In this embodiment, the semiconductor transistor is P type, and thus a P type dopant, such as boron, is used.

Figure 5:
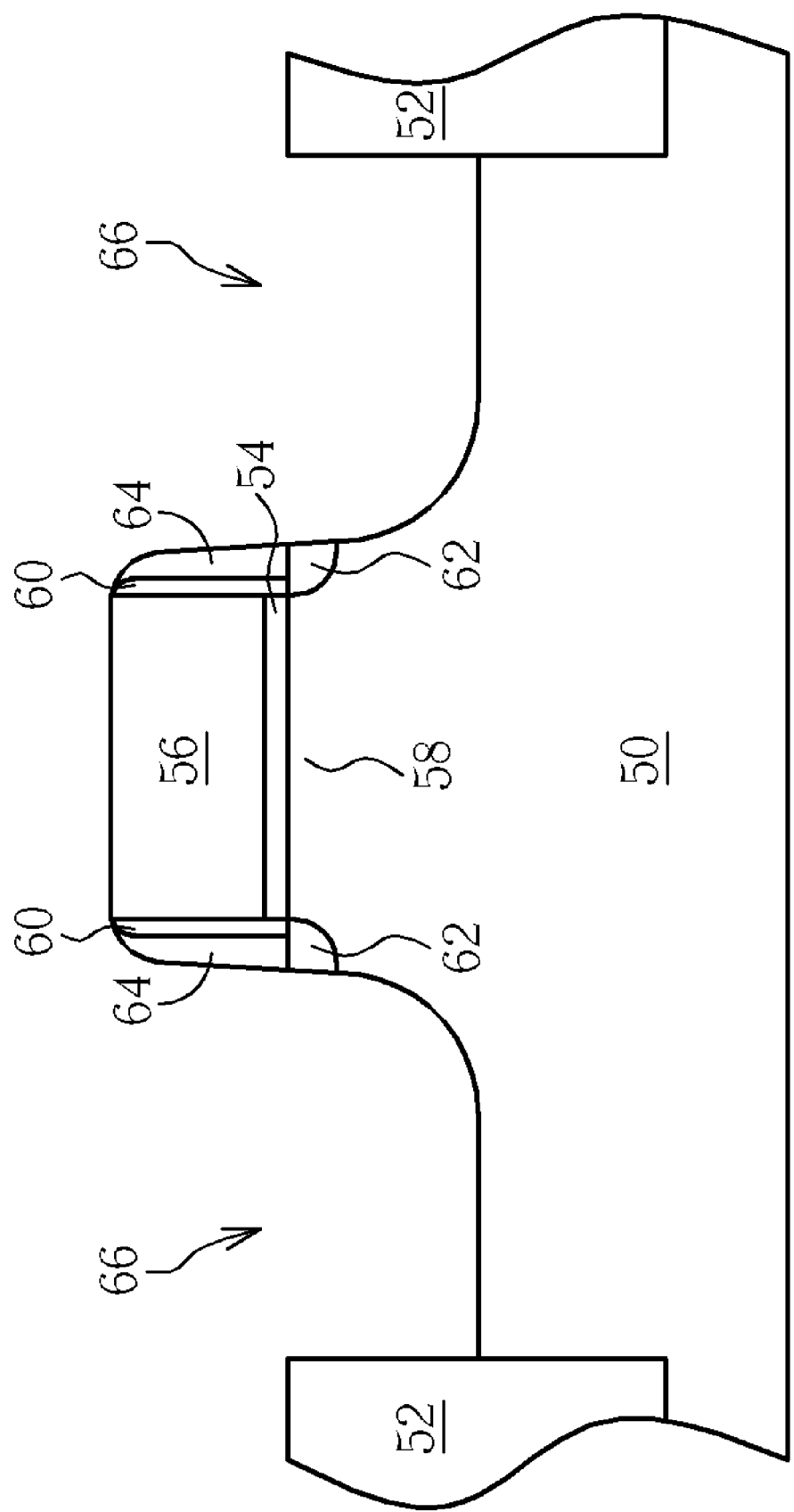
Figure 6:
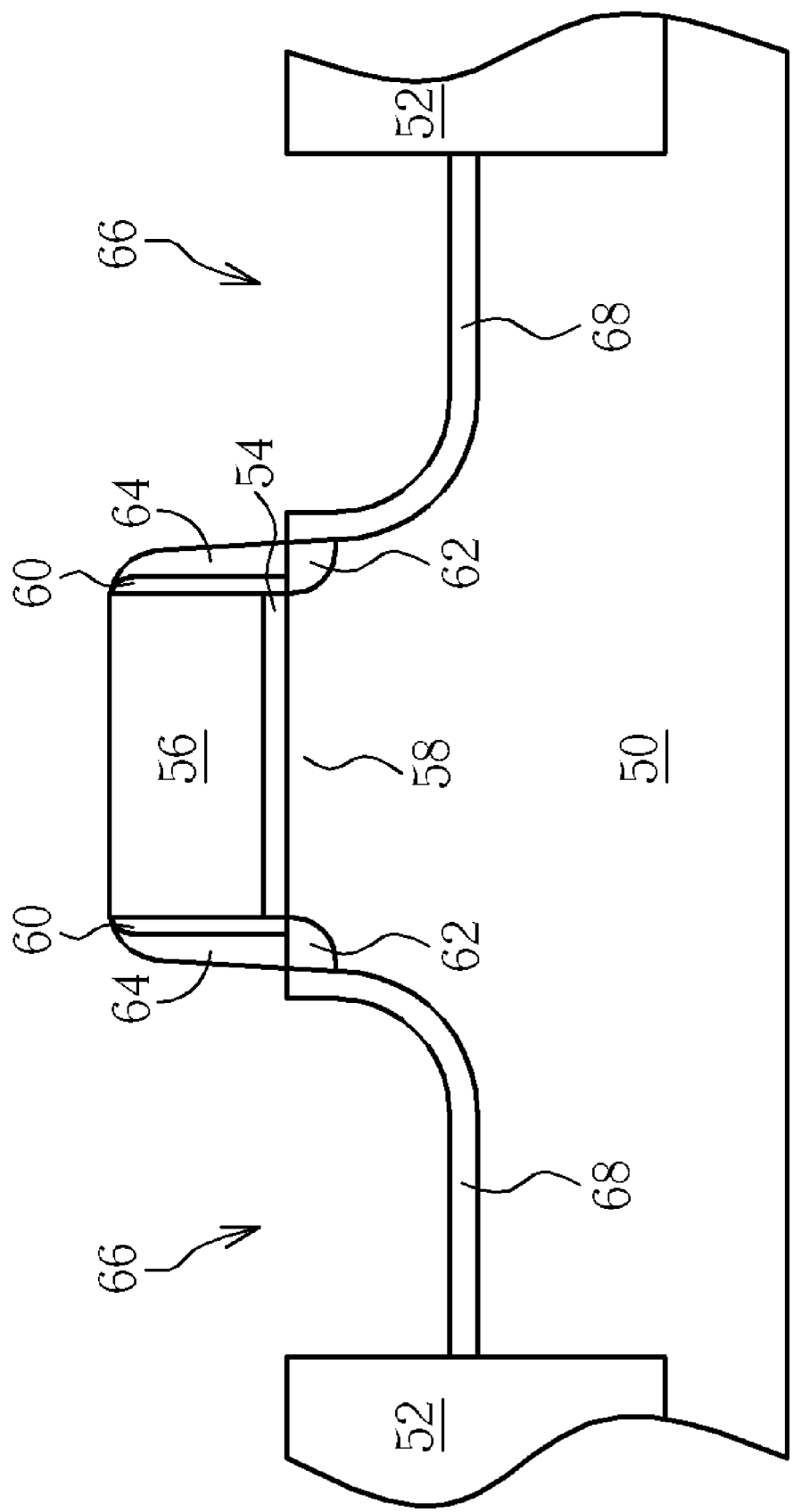

As shown in FIG. 5, two main spacers 64 are formed alongside the offset spacers 60. Then, an etching process is performed to remove a portion of the substrate 50 alongside the main spacers 64 to respectively form two recesses 66 on two opposite sides of the gate 56. As shown in FIG. 6, silicon germanium is epitaxially grown on the inner wall of the recesses 66 to form two peripheral regions 68. The epitaxially-formed silicon germanium is composed of monocrystalline silicon and germanium, and the percentage of germanium in each peripheral region 68 is graded. In this embodiment, the percentage of germanium increases from 0% to 30% from the inner wall of the recess 66.

Figure 7:
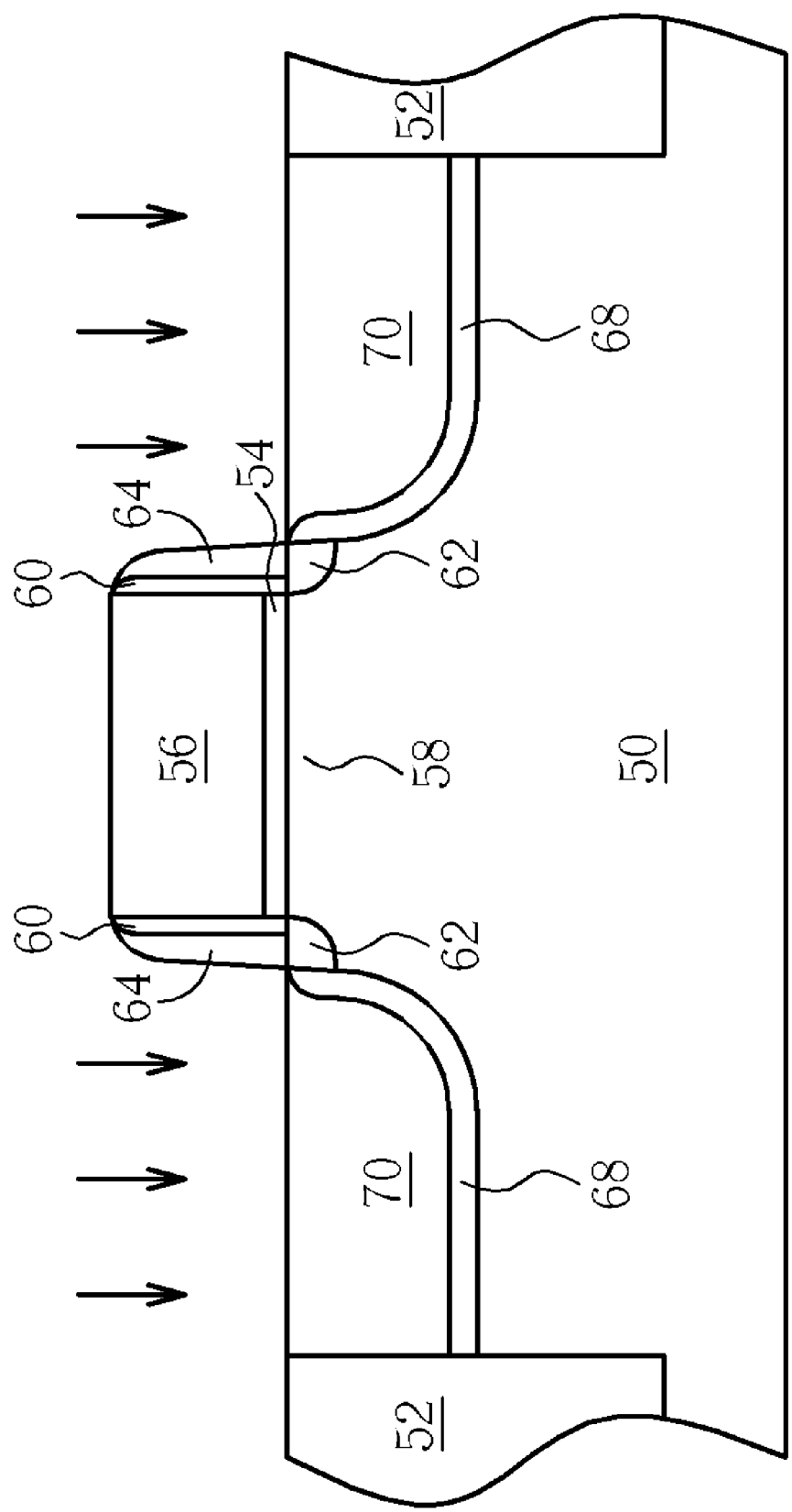

As shown in FIG. 7, silicon germanium is again epitaxially grown in the recesses 66 to respectively form two main regions 70 above the peripheral region 68. In each main region 70, the percentage of germanium is maintained constant. In this embodiment, the percentage of germanium is held at 30%. It is noted that the peripheral regions 68 and the main regions 70 are formed in two steps in this embodiment. However, the peripheral regions 68 and the main regions 70 can also be formed in an in-situ manner. Subsequently, an implantation process using a P type dopant, such as boron, is performed upon the main regions 70 and the peripheral regions 68.

Figure 8:
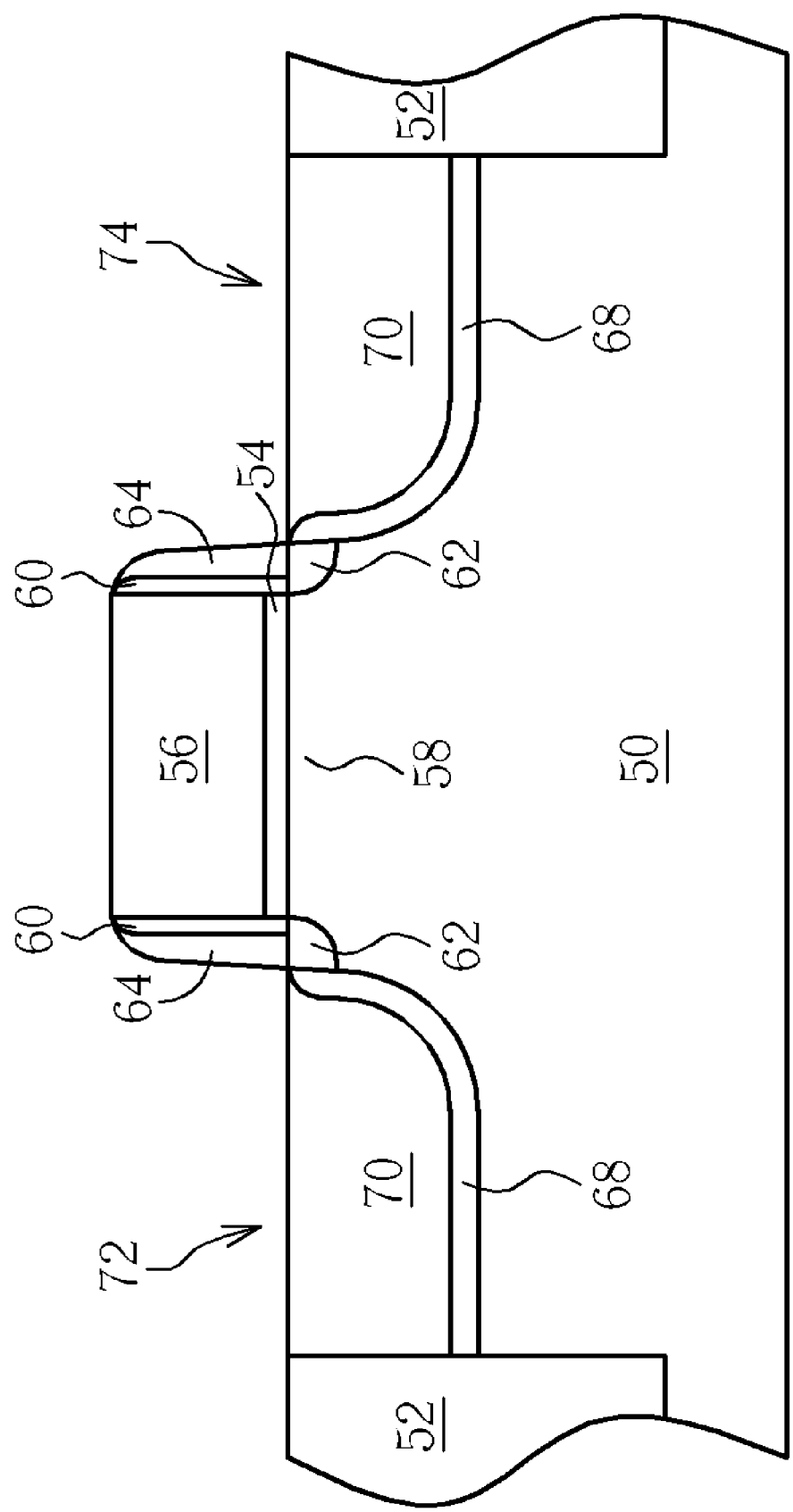

As shown in FIG. 8, at least a thermal process, such as a rapid thermal process (RTP), a laser annealing process, or a flash process, is performed to activate the main regions 70 and the peripheral regions 68. If a laser annealing process or a flash annealing process is selected, the process temperature is between about 1200 to 1400 degrees Celsius. Following that, self-aligned salicide (not shown), for instance cobalt salicide or nickel salicide, can be formed on the surface of the main regions 70. Accordingly, a source region 72 and a drain region 74 are formed.

In the above embodiment, a PMOS transistor is exemplarily illustrated. If an NMOS transistor is to be formed, germanium is replaced by carbon, and N type dopants are used in the implantation processes for forming the lightly doped regions 62 and for forming the source region 72 and the drain region 74.

In comparison with the conventional semiconductor transistor, the source region and the drain region each include a main region in which the percentage of germanium (or carbon) is held constant and a peripheral region in which the percentage of germanium (or carbon) is graded. Accordingly, the interface mismatch defect between the source region (also the drain region) and the substrate is reduced. Therefore, the reliability and performance of the semiconductor transistor of the present invention is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor transistor comprising:
    a substrate;
    a gate insulating layer positioned on the surface of the substrate;
    a gate positioned on the gate insulating layer;
    a channel region positioned in the substrate corresponding to the gate; and
    a source region and a drain region respectively positioned alongside the channel region, the source region and the drain region including a first material and a second material, the first material and the second material having a same lattice structure and different spacing, both the source region and the drain region comprising a main region and a peripheral region, wherein the main region of the source region comprises the first material and the second material, the main region of the drain region comprises the first material and the second material, a percentage of the second material in the main region of the source region and a percentage of the second material in the main region of the drain region are constant, and a percentage of the second material in the peripheral region of the source region and a percentage of the second material in the peripheral region of the drain region are graded, and wherein the peripheral region of the source region surrounds a bottom portion of the main region of the source region, and the peripheral region of the drain region surrounds a bottom portion of the main region of the drain region.

2. The semiconductor transistor of claim 1, wherein the percentage of the second material in each peripheral region decreases from an interface between the main region and the peripheral region to an interface between the peripheral region and the substrate.

3. The semiconductor transistor of claim 2, wherein the percentage of the second material in each peripheral region decreases from 30% to 0%.

4. The semiconductor transistor of claim 3, wherein the percentage of the second material in each main region is approximately 30%.

5. The semiconductor transistor of claim 1, wherein the first material is monocrystalline silicon.

6. The semiconductor transistor of claim 1, wherein the second material is germanium.

7. The semiconductor transistor of claim 6, wherein the semiconductor transistor is P type.

8. The semiconductor transistor of claim 1, wherein the second material is carbon.

9. The semiconductor transistor of claim 8, wherein the semiconductor transistor is N type.

10. The semiconductor transistor of claim 1, wherein the first material and the second material are formed epitaxially.

* * * * *